United States Patent [19]

Ogata et al.

[11] Patent Number: 4,875,284
[45] Date of Patent: Oct. 24, 1989

[54] PROCESS FOR PRODUCING A PACKAGE FOR PACKING SEMICONDUCTOR DEVICES

[75] Inventors: Kiyoshi Ogata; Yasunori Ando; Eiji Kamijo; Noriaki Matsumura, all of Kyoto, Japan

[73] Assignee: Nissin Electric Company, Ltd., Kyoto, Japan

[21] Appl. No.: 168,056

[22] Filed: Mar. 14, 1988

Related U.S. Application Data

[62] Division of Ser. No. 48,357, May 11, 1987, now Pat. No. 4,831,212.

[30] Foreign Application Priority Data

May 9, 1986 [JP] Japan ................... 61-107402
May 9, 1986 [JP] Japan ................... 61-107403
May 9, 1986 [JP] Japan ................... 61-107404

[51] Int. Cl.$^4$ .............................................. H05K 3/02
[52] U.S. Cl. ........................................ 29/830; 29/846
[58] Field of Search .................. 174/12; 29/830, 846, 29/577.2, DIG. 44

[56] References Cited

U.S. PATENT DOCUMENTS

4,656,499  4/1987  Butt ........................... 357/74

Primary Examiner—Timothy V. Eley
Attorney, Agent, or Firm—Sughrue, Mion, Zinn, Macpeak & Seas

[57] ABSTRACT

In a package comprising a chip mounting base and a cap to be fitted on the base, the base comprises a metal substrate, an electrically insulating ceramic layer formed on the metal substrate, a patterned metal layer formed on the ceramic layer in a selected area thereof, a first mixed layer formed in an area near the interface between the metal substrate and the ceramic layer, and a second mixed layer formed in an area near the interface between the ceramic layer and the metal layer, and the cap comprises a metal substrate, an electrically insulating ceramic layer formed in at least the marginal portion of the side of the metal substrate which faces the base, and a mixed layer that is formed in an area near the interface between the metal substrate and the ceramic layer.

2 Claims, 2 Drawing Sheets

PROCESS FOR PRODUCING A PACKAGE FOR PACKING SEMICONDUCTOR DEVICES

This is a divisional application of Ser. No. 07/048357, filed 05/11/87, now Pat. No. 4,831,212.

BACKGROUND OF THE INVENTION

The present invention relates to a package for packaging chips of ICs and other semiconductor devices. the present invention also relates to a process for producing such a package.

Recent advances in the technology of chips of ICs and other semiconductor devices are remarkable and active efforts are being made to increase the scale and the integrating density of such chips. One of the problems that accompany these efforts is how to effectively dissipate the heat generated in chips. Conventionally, alumina ($Al_2O_3$) packages have been used with microelectronic chips but in order to achieve more efficient heat dissipation, various new types of packages have been proposed and reviewed. Among them are: (1) a ceramic package made of a material having good heat conductivity such as BeO, AlN or SiC; (2) an enamelled package consisting of an iron sheet with an enamel coating; (3) a package consisting of a metal substrate to which an insulator is bonded with an adhesive; (4) a package consisting of a metal substrate on which a ceramic powder is flame-sprayed; (5) a package consisting of a metal substrate on which a thin ceramic film is formed by a suitable method such as physical vapor deposition (PVD) or chemical vapor deposition (CVD); and (6) a package consisting of a metal substrate on the surface of which an insulating organic polymer layer is formed.

However, these packages have their own problems described below and are not completely satisfactory for use in practical applications.

(1) A ceramic package made of a good heat conductor such as BeO, AlN or SiC conducts 5–20 times as much heat as an alumina substrate but its manufacture requires a complicated process comprising purification of the starting powder, controlling the particle size of the powder, shaping the powder into a compact and sintering the compact. In addition, the need for performing sintering at elevated temperatures (1500°–2000° C.) involves such disadvantages as difficulty in preparing a large package, development of thermal distortion and high cost. Of the three materials mentioned above, BeO has the highest heat conductivity but because of its toxic nature and high cost it can be used in only a very limited area.

(2) The manufacture of an enamelled package involves fusing enamel frit in the high temperature range of 650°–800° C., so that the resulting enamel layer as an insulator has a minimum thickness of 0.5 mm and reduces the heat conductivity of the package. A thin ($\leq 0.1$ mm) enamel coat contains so many pinholes in its surface that its withstand voltage (dielectric strength) will fall to a commercially unacceptable level.

(3) A package consisting of a metal substrate to which an insulator such as alumina is bonded with an adhesive has also not been commercialized for several reasons such as an increased resistance to heat conduction in the adhesive layer and unevenness in the adhesive strength of various parts of the package.

(4) A package consisting of a metal substrate on which a ceramic powder is thermal-sprayed contains so many pinholes in the sprayed insulation layer that it does not have sufficient withstand voltage or the desired surface flatness of the insulation layer.

(5) A package consisting of a metal substrate on which a thin ceramic film is formed by a suitable method such as PVD or CVD requires heating at 500° C. or higher in order to form the thin ceramic film and this causes such disadvantages as a decreased freedom in the choice of a suitable metal substrate and a reduction in the strength of the substrate. In addition, the adhesion between the thin ceramic film and the metal substrate is not strong and a great amount of unevenness is introduced in the film quality.

(6) A package having a thin organic polymer layer is also disadvantageous in that polymers have poor heat resistance and are not highly heat-conductive to serve as an efficient heat dissipater.

Metal layers that establish connection to the device or provide an interconnecting circuit are usually formed on the insulator (or insulating layer) of each of the packages described above. Conventionally, these metal layers are formed by techniques such as bonding with an adhesive, a thick-film process, PVD and CVD. A problem common to these techniques is that the metal layer does not adhere strongly to the insulation layer and separation between the two layers may readily occur if thermal stress is produced by for example, the soldering of lead wires. If one wants to provide stronger adhesion between the metal layer and the insulating layer, precise process control must be performed but then this results in high manufacturing cost.

Further, when a package is formed with a so-called thin film type laminated substrate 2 as shown in FIG. 5 in which ceramic thin film layers 6a, 6b, . . . and metal thin film layers 8a, 8b . . . are laminated on a base material 4, connection between different levels of thin metal layers must be established. Conventionally, a variety of processes such as forming through-holes in ceramic layers by plasma etching or with a micro drill, followed by printing a circuit pattern or depositing a thin metal layer and metalization, have been used. However, these processes have several problems to be solved such as the great length of time they require and the difficulty involved in achieving the required precision of working.

SUMMARY OF THE INVENTION

An object, therefore, of the present invention is to provide a highly economical package that has good characteristics such as high electrical insulation, heat conductivity and reliability and the topmost metal layer of which adheres strongly to an underlying layer and will not easily separate from the latter.

Another object of the present invention is to provide a process for producing such an improved package.

Still another object of the present invention is to provide a process by which metal layers in a thin-film type laminated substrate can be readily interconnected in a precise manner.

A package of the present invention comprises a chip mounting base and a cap to be fitted on the base, the base comprising a metal substrate, an electrically insulating ceramic layer formed on the metal substrate, a patterned metal layer formed on the ceramic layer in a selected area thereof, a first mixed layer formed in an area near the interface between the metal substrate and the ceramic layer, and a second mixed layer formed in an area near the interface between the ceramic layer and the metal layer, and the cap comprising a metal substrate, an electrically insulating ceramic layer formed in at least the marginal portion of the side of the metal substrate which faces the base, and a mixed layer that is formed in an area near the interface between the metal substrate and the ceramic layer.

In a process of producing a package comprising a chip mounting base and a cap to be fitted on the base according to the present invention, the base is prepared by the following steps; a step wherein a vaporized material is deposited, and an accelerated ion beam is allowed to impinge, on a metal substrate in a vacuum so as to form an electrically insulating ceramic layer on the metal substrate and a mixed layer in an area near the interface between the metal substrate and the ceramic layer; a step wherein a metal vapor is deposited, and an accelerated ionized inert gas is allowed to impinge, on the ceramic layer formed in the first step, so as to form a metal layer on the ceramic layer and a mixed layer in an area near the interface between the ceramic layer and the metal layer; and a step of patterning the metal layer; said cap being prepared by a step wherein a vaporized material is deposited, and an accelerated ion beam is allowed to impinge, on a metal substrate in vacuum in at least the marginal portion thereof, so as to form an electrically insulating ceramic layer on the metal substrate in at least the marginal portion thereof and a mixed layer in an area near the interface between the metal substrate and the ceramic layer.

A process of providing interconnections of metal layers in the production of a laminated substrate comprising thin metal layers and electrically insulating thin ceramic layers according to one example of the present invention comprises a first step of evaporating a metal on the thin ceramic layer in a vacuum with a mask being disposed on the ceramic layer, and a second step wherein the evaporated metal is heated to diffuse into the thin ceramic layer so as to form an alloyed area in the latter that provides an electrical connection between the two surfaces thereof.

In the first step of the method of the present invention, a predetermined pattern of metal is evaporated on the thin ceramic layer, and in the second step, the evaporated metal is diffused into the thin ceramic layer to form an alloyed area in a predetermined pattern that establishes an electrical connection between the two surfaces of the ceramic layer, or interconnection of the thin metal layer on top of the ceramic layer to the thin metal layer below.

A process of providing interconnection of metal layers in the production of a laminated substrate comprising thin metal layers and electrically insulating thin ceramic layers according to another example of the present invention comprises injecting a micro ion beam of a metal into a predetermined area of the thin ceramic layer in vacuum so as to form an alloyed area in the ceramic layer that provides an electrical connection between the two surfaces of the latter.

The alloyed area formed in the thin ceramic layer provides a patterned conductor that establishes an electrical connection between the thin metal layer on top of the ceramic layer and the thin metal layer below. The micro ion beam used in the method of the present invention enables the alloyed area to be formed in a fine-line pattern and in a precise manner.

DESCRIPTION OF PREFERRED EMBODIMENTS

Figure 1:
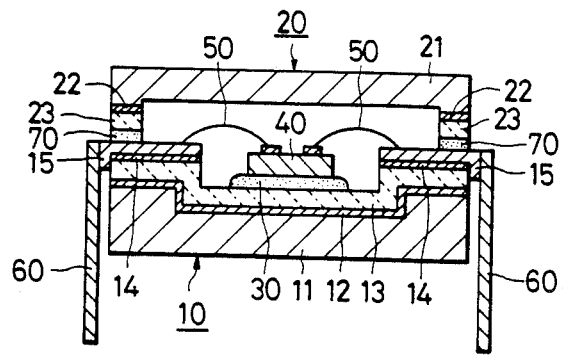
FIG. 1 is a cross sectional view of a package according to one embodiment of the present invention.

FIG. 1 is a cross sectional view of a package according to one embodiment of the present invention. The package shown in FIG. 1 is of the Cer-DIP type and comprises a base 10 for mounting an IC or semiconductor device chip 40 and a cap 20 that is fitted on the base 10 to provide a closed space. A lead frame 60 is provided on both lateral sides of the package.

Stated more specifically, the base 10 consists of a metal substrate 11 having a cavity in which the chip 40 is to rest, an electrically insulating ceramic layer 13 formed on the metal substrate 11, a metal layer 15 in a patterned circuit that is formed in the marginal portion of the ceramic layer 13 and which extends beyond the lateral edges of the package, a mixed layer 12 formed in an area near the interface between the metal substrate 11 and the ceramic layer 13, and another mixed layer 14 formed in an area near the interface between the ceramic layer 13 and the metal layer 15, each of these mixed layers being composed of the materials of the layers situated on both sides thereof.

In the embodiment shown in FIG. 1, the chip 40 is joined (e.g. brazed) to the bottom of the cavity in the base 10 with a suitable joining material 30. Electrodes on the chip 40 are bonded to the patterned metal layer 15 with metal (e.g. Au or Al) wires 50. The metal layer 15 extending beyond both lateral sides of the package is conductively joined (e.g. brazed) to the lead frame 60.

The cap 20 consists of a box-shaped metal substrate 21, an electrically insulating ceramic layer 23 formed in the periphery of the metal substrate 21 on the side where it faces the base 10, and a mixed layer 22 that is formed in an area near the interface between the metal substrate 21 and the ceramic layer 23 and which is composed of the materials of the layers situated on both sides thereof.

In the embodiment being discussed, the cap 20 is placed on the base 10 carrying the appropriately wire-bonded chip 40 and the two components are hermetically sealed together with a sealant 70 such as a low-melting point glass.

The material of the metal substrates 11 and 21 is preferably selected from among those which have high heat conductivities and the thermal expansion coefficients of which are close to that of the chip 40. Useful materials are Al, Al alloys, Cu, Cu alloys, stainless steel, Fe-42 Ni, and Kovar. The material of the metal substrate 11 may be the same as or different from that of the metal substrate 21. The shape of the metal substrate 11 and 21 is by no means limited to what is shown in FIG. 1 and various other shapes may be selected depending upon such factors as the use of the package to be finally produced.

The material of the ceramic layers 13 and 23 is preferably selected from among those which have good heat conducting and electrically insulating properties and low dielectric constants and the thermal expansion coefficients of which are close to that of the chip 40 which is to be mounted on the finally produced package. Useful materials include cubic boron nitride (C-BN), boron nitride (BN) containing cubic BN, aluminium nitride (AlN), boron phosphide (BP), diamond, diamond-like carbon, and silicon nitride ($Si_3N_4$). The material of the ceramic layer 13 may be the same as or different from that of the ceramic layer 23. In the embodiment shown, the ceramic layer 23 and mixed layer 22 are formed only in the periphery of the metal substrate 21 of the cap 20. If required, these layers may be formed on the entire surface of the side of the metal substrate 21 which faces the base 10.

The material of the metal layer 15 is preferably selected from among those which have high electrical conductivity such as W, Mo, Ni, Cu, Al, Au, Ag and various allloys thereof. In the embodiment under discussion, the metal layer 15 is not formed on the ceramic layer 13 near the area where it is joined to the chip 40 but if required, the metal layer 15 may also be formed at a site near that area.

In the embodiment shown in FIG. 1, the lead frame 60 is joined to the downwardly bent portion of the metal layer 15 which extends beyond both lateral edges of the base 10. Instead, one end of the lead frame 60 may be bent such that it can be joined to the metal layer 15 on the top surface of the base 10. The package shown in FIG. 1 is of the Cer-DIP type but the concept of the present invention is also applicable to other types of package such as single in-line package (SIP), flatpack (FP), chip carrier, and plug-in package.

The package described above has the following features.

(1) The base 10 comprises a metal substrate 11 having high heat conductivity to which a ceramic layer 13 having good heat conducting and electrically insulating properties adheres strongly. Therefore, the base 10 exhibits good electrical insulation and heat conduction. The cap 20 also has these features. As a result, a higher scale of integration and faster operation of the chip 40 can be realized without causing deterioration or erroneous operation due to the heat generated by the chip.

(2) No adhesive is used in the base 10 between the metal substrate 11 and the ceramic layer 13 or between the ceramic layer 13 and the metal layer 15. Because of the presence of two mixed layers 12 and 14, both the interface between the metal substrate 11 and the ceramic layer 13 and the interface between the ceramic layer 13 and the metal layer 15 have a continuously varying composition. As a result, very good heat conduction is assured both between the metal substrate 11 and the ceramic layer 13 and between the ceramic layer 13 and the metal layer 15. The cap 20 also has this feature.

(3) The mixed layers 12 and 14 in the base 10 act as if they were wedges and provide good adhesion both between the metal substrate 11 and the ceramic layer 13 and between the ceramic layer 13 and the metal layer 15 so that neither the ceramic layer 13 nor the metal layer 15 will easily separate from the underlying layer. In addition, any thermal expansion mismatch that exists either between the metal substrate 11 and the ceramic layer 13 or between the ceramic layer 13 and the metal layer 15 will be effectively absorbed by the mixed layer 12 or 14, respectively, having continuously varying compositions to prevent the occurrence of cracking. As a result, the base 10 has high reliability. The cap 20 also has these features.

(4) The thickness of the ceramic layer 13 on the metal substrate 11 of the base 10 can be sufficiently decreased to ensure even better heat conduction between the metal substrate 11 and the chip 40 mounted on the base 10.

(5) Compared with a ceramic substrate used alone, both the base 10 and cap 20 can be produced into a large surface, in an easy and economical manner.

Figure 2:
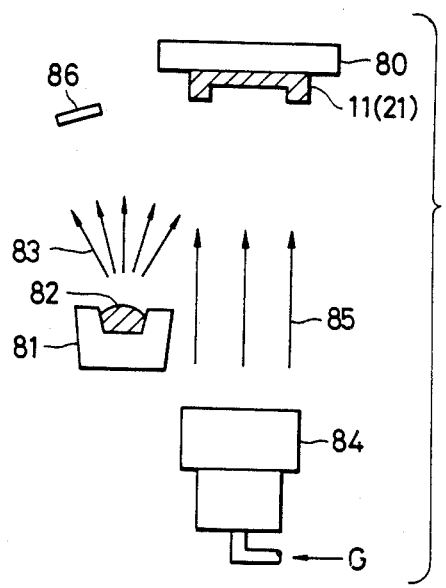
FIG. 2 is a sketch of an apparatus that is used to produce a package by the process of the present invention.

An example of the process for producing the package is hereunder described with reference to FIG. 2, which is a sketch of an apparatus that is used to implement the process of the present invention.

Production of the base 10 is first described. A metal substrate 11 of the type described hereinabove is attached to a holder 80 and placed in a vacuum chamber (not shown) which also contains an evaporation source 81 and an ion source 84, each being directed toward the metal substrate 11. It is preferable to polish and clean the surface of the metal substrate 11 before the operation is started. The evaporation source 81 may employ an electron beam to heat an evaporant 82. The ion source 84 is preferably of the bucket type by which a supplied gas G is ionized to form a uniform ion beam 85 of a large area which is allowed to impinge on the metal substrate 11 so that it can be treated over a large surface area at a time. The thickness of the film being formed on the metal substrate 11 is checked with a monitor 86.

The choice of the evaporant 82 and the ion species in the beam 85 is made on the basis of the material of the ceramic layer 13 (or 23) to be formed on the metal substrate 11 (or 21), and useful combinations are as follows:

(1) When the ceramic layer is formed from cubic BN or BN containing cubic BN: Boron (B) is selected as the evaporant 82 and nitrogen (N) ion as the ion in beam 85.

(2) When the ceramic layer is formed from AlN: Aluminum (Al) is selected as the evaporant 82 and nitrogen ion as the ion in beam 85. If the metal substrate 11 is made of Al, only N ions may be injected into its surface in the initial stage of operation. In this case, the amount of implantation of N ions may preferably range from about $1 \times 10^{16}$ to about $1 \times 10^{18}$ ions/cm$^2$. If this condition is met, sputtering is suppressed and yet an AlN film having high resistivity can be formed.

(3) When the ceramic layer is formed from BP: The evaporant 82 is boron and the iron in beam 85 is phosphorus (P) ion, or vice versa.

(4) When the ceramic layer is formed from diamond or diamond-like carbon: The evaporant 82 is carbon (C) and the ion in beam 85 is at least one member selected from among carbon ions, hydrogen ions and ionized inert gases such as argon, the ion beam 85 optionally containing a silicon ion as a promoter of diamond formation.

(5) When the ceramic layer is formed from $Si_3N_4$: The evaporant 82 is carbon and the ion beam 85 is formed of nitrogen ions.

The operation of film formation will proceed as follows: the vacuum chamber is evacuated to a pressure of, e.g., about $10^{-5}$–$10^{-7}$ Torr; then, in order to form a ceramic layer 13, the evaporant 82 in the evaporation source 81 is vaporized to produce a vapor 83 that is deposited on the metal substrate 11 and simultaneously or alternately with this evaporative deposition, the ion beam 85 from the iron source 84 is allowed to impinge on the metal substrate 11; as a result of the knock-on effect of the ion beam 85, the mixed layer 12 is formed on the metal substrate 11 in the initial stage of this film formation, and the ceramic layer 13 is subsequently formed to produce a base 10 having the ceramic layer 13 and the underlying mixed layer 12 formed on the metal substrate 11 as shown in FIG. 1.

The compositional ratio of vapor to ion (i.e., the ratio of the number of vapor particles to that of ion particles) may be determined for an appropriate value in accordance with the material of which the ceramic layer 13 is to be formed.

The ion beam 85 is preferably accelerated by an energy of no higher than 50 keV. If a higher acceleration energy is employed, the sputtering action of the ion beam 85 is increased to potentially cause the following two problems: first, a film with a smooth surface cannot be attained; secondly, more damaged areas (e.g. defects) will form in the bulk of the ceramic layer 13 to decrease the chance of forming a ceramic layer of good quality.

If desired, the ceramic layer 13 may be formed while the surface of the metal substrate 11 is heated with a suitable heating mechanism (not shown) to a temperature of up to about, e.g., 500° C. This is effective for the purpose of decreasing the development of damaged areas or the formation of cavities or voids due to injected ions. The reaction of film formation may also be promoted by employing this method.

In the next step, using the evaporation source 81 and the ion source 84 described above, a metal vapor is deposited on the ceramic layer 13 and thereafter, or simultaneously therewith, an accelerated ionized inert gas is allowed to impinge on the ceramic layer 13. The evaporant 82 employed in this step is selected from among such metals as W, Mo, Ni, Cu, Al, Au, Ag and various alloys. The ion species in beam 85 is selected from among the ions of inert gases such as argon, xenon and nitrogen. As a result of this step, the metal layer 15 is formed on the ceramic layer 13 while the mixed layer 14 is formed in an area near the interface between the metal layer 15 and the ceramic layer 13.

The metal layer 15 may be formed in a patterned circuit by performing metal evaporation and ion implantation in the manner described above with a mask having a predetermined pattern being placed in contact with the ceramic layer 13. If this method is used, no separate step is required to form a patterned circuit and yet a metal layer 15 having a patterned electric circuit can be formed in a selected area over the ceramic layer 13. Of course, a desired electric circuit pattern may be formed by patterning the already formed metal layer 15 employing a conventional technique such as etching. As a consequence of the procedures described above, a base of the type indicated by 10 in FIG. 1 is produced.

The metal layer 15 is preferably deposited in a thickness that is approximate to the range (i.e., mean projective range) of the ions in beam 85 being injected. By selecting this value, the mixed layer 14 can be effectively formed right in the area near the interface between the metal layer 15 and the ceramic layer 13. After the formation of the mixed layer 14, further vapor deposition may be performed in order to increase the thickness of the metal layer 15.

The ion beam 85 is preferably accelerated by an energy of no higher than about 50 keV. If a higher acceleration energy is employed, the sputtering action of the ion beam 85 is increased to decrease the possibility of forming a smooth-surfaced film.

The above described process may be performed while the surface of the ceramic layer 13 is heated with a suitable heating mechanism (not shown) to a temperature of up to about 400° C. This method enables the mixed layer 14 to be formed in an efficient manner while good interdiffusion is ensured between the metal layer 15 and the ceramic layer 13.

The process for preparing the cap 20 is described hereinafter. First, the metal substrate 21 is attached to the holder 80 shown in FIG. 2, and as in the preparation of the base 10 described above, the vapor 83 of the evaporant 82 is deposited, and the accelerated ion beam 85 is allowed to impinge, on the metal substrate 21, thereby forming the ceramic layer 23 on the metal substrate 21 and the mixed layer 22 in an area near the interface between the substrate 21 and the cermaic layer 23. In this way, the cap 20 is produced. A mask or some other suitable means may be employed if the ceramic layer 23 and the mixed layer 22 are to be formed only in the marginal portion of the metal substrate 31. The other aspects of the method for preparing the cap 20 are essentially the same as in the case of forming the ceramic layer 1 and the mixed layer 12 in the base 10 and the explanation is not described here in detail. The ceramic layer 23 and the mixed layer 22 may be formed on the metal substrate 21 in a step which is either simultaneous with or separate from the step of forming the ceramic layer 13 and the mixed layer 12 on the metal substrate 11.

The base 10 and the cap 20 prepared by the procedures described above are subsequently assembled by the already described known techniques: the metal layer 15 of the base 10 is joined to the lead frame 60; the chip 40 is mounted on the base 10; the chip 40 is wire-bonded to the metal layer 15; and the cap 20 is sealed to the base 10 with the sealant 70 thereby fabricating a device of the type shown in FIG. 1.

The above-described process of the present invention for producing a package has the following features.

(1) The use of comparatively low temperatures (≦about 500° C.) of treatment permits a package of good quality to be formed without causing any undue thermal distortion or cracking.

(2) Ceramic layers 13 and 23 having low impurity levels and uniform quality and thickness can be attained, and this leads to the production of a package having improved electrical insulation and heat conduction.

(3) Very thin ceramic layers 13 and 23 can be formed, which also contributes to the production of a highly heat-conductive package.

(4) The mixed layers 12, 14 and 22 allow the ceramic layers 13 and 23 and the metal layer 15 to adhere strongly to the adjacent layer and the resulting package is highly reliable in that the individual constituent layers will not easily separate from one another.

(5) The package produced by this process has a high degree of surface smoothness in the ceramic layer 13 and ensures good adhesion and heat conduction to the chip 40 to be mounted on the package.

(6) The process allows treatment of a large surface area in one operation and is simple, so that packages can be produced at low costs.

(7) Micropatterning of the metal layer 15 can be achieved by the use of a mask and the resulting increase in the number of pins available permits the packaging of IC or other semiconductor device chips having high integration levels.

Figure 5:
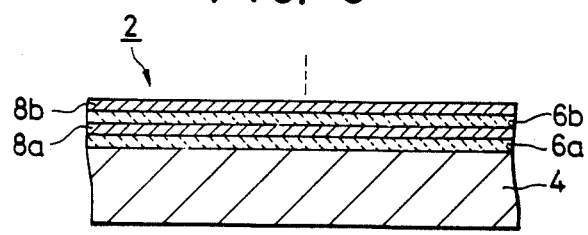
FIG. 5 is a partial enlarged cross sectional view of an illustrative laminated substrate.

The base 10 of a package may be formed with a laminated substrate 2 as shown in FIG. 5. In this case, connection between thin metal layers must be established. FIG. 3 is a diagram showing the sequence of steps of interconnecting metal layers according to one example of the method of the present invention. The metal layers to be interconnected in this case are thin metal layers 8a and 8b in the laminated substrate 2 shown in FIG. 5.

Figures 3A, 3B, 3C:
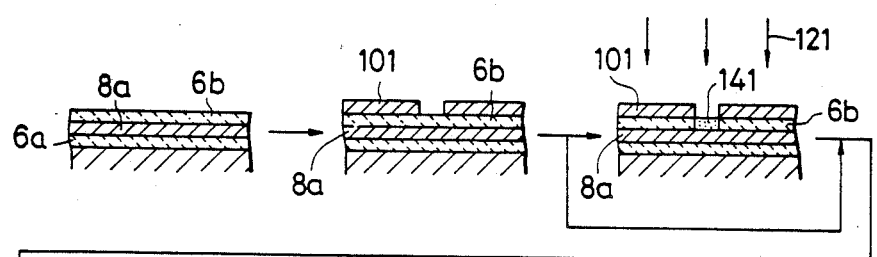
FIGS. 3(A)–3(F) are diagrams showing the sequence of steps of interconnecting metal layers according to one example of the method of the present invention.

First, a substrate having a thin ceramic layer 6b deposited on a thin metal layer 8b is provided [FIG. 3(A)]. A mask 101 having a predetermined pattern is then placed on top of the ceramic layer 6b [FIG. 3(B)]. The resulting assembly is accommodated in a vacuum chamber (not shown). The chamber is evacuated and a metal (metal vapor) 161 from an evaporation source (not shown) is deposited on the ceramic layer 6b in the area that is not covered with the mask 101 [FIG. 3(D)].

The mask 101 has been patterned to provide a desired circuit pattern. The thickness of the mask 101 corresponds to the maximum thickness of the metal 161 to be evaporated on the ceramic layer 6b and is preferably equal to or greater than the thickness of the ceramic layer 6b. This condition is necessary to ensure that good electrical connection is established between the two surfaces of the ceramic layer 6b when the metal 161 is diffused into the ceramic layer 6b in the subsequent step to be described below. For example, less than several thousands Å is adequate for the thickness of the ceramic layer 6b if the laminated substrate to be finally produced is intended for use with semiconductor devices.

The metal 161 is preferably such that it readily forms an alloy with the ceramic layer 6b while providing a small resistance to electrical conduction and producing no impurities. A typical example is gold (Au). To put this in other way, the ceramic layer (e.g. 6b) which is to form an alloyed area 201 to be described below is preferably formed of a material such as AlN or $Si_3N_4$ that readily alloys with Au or any other kind of metal 161.

Figures 3D, 3E, 3F:
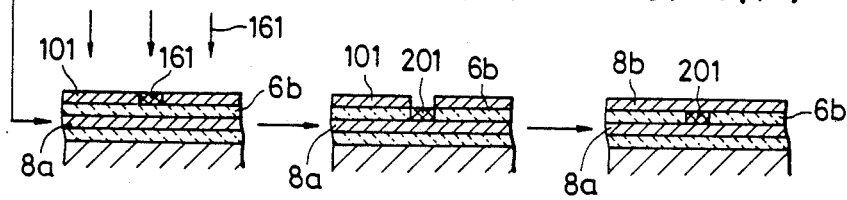

Simultaneously with or following the step of evaporation described above, the evaporated metal 161 and the other members of the assembly are heated to a temperature of about 200°–600° C. with a suitable heating mechanism (not shown) such as heater or an infrared lamp so that the metal 161 will diffuse into the ceramic layer 6b to form an alloyed area 201 (i.e., made of an alloy of the metal 161 and the ceramic layer 6b) in said layer 6b that provides an electrical connection between the two surfaces thereof [FIG. 3(E)]. As a result of this step, a patterned conductor is formed that provides an electrical connection between the metal layer below the ceramic layer 6b and the metal layer to be subsequently formed on top of the layer 6b.

After the mask 101 is placed on the ceramic layer 6b and before evaporation of the metal 161 is conducted [that is, before the step shown in FIG. 3(D)], a beam 121 of ionized inert gas such as argon or xenon from an ion source (not shown) may be injected through the mask 101 into the surface of that part of the ceramic layer 6b on which the metal 161 is to be evaporated, so as to form an ion-damaged area 141 [FIG. 3(C)]. This is effective for the purpose of allowing more of the metal 161 evaporated in the subsequent step to diffuse into the ceramic layer 6b and thereby further accelerating the alloying of the area of the ceramic layer which corresponds to the evaporated metal 161.

The acceleration energy of the ion beam 121 is preferably selected for a value that renders the range (i.e., mean projective range) of the beam 121 approximately equal to the thickness of the ceramic layer 6b. By selecting this value, the damaged area 141 can be effectively created chiefly within the ceramic layer 6b. Ion implantation is preferably effected with a bucket-type ion source which enables a large area to be treated at a time. During ion implantation, cavities or voids may be created in the damaged area 141 by the injected ions and, in order to avoid this problem, the ceramic layer 6b may be heated to a temperature between about 200° and 600° C. during or after the ion implantation.

After the alloyed area 201 has been formed in the ceramic layer 6b by the procedure described above, the mask 101 is removed and another thin metal layer 8b is deposited on the ceramic layer 6b [FIG. 3(F)], with the result that the two metal layers 8a and 8b isolated by the ceramic layer 6b are interconnected in a predetermined pattern via the alloyed area 201. If more than one ceramic layer is to be formed in a laminated substrate, each ceramic layer may be treated by repeating the cycle of the procedures described above as many times as required.

Unlike the prior art technique of establishing interconnection of metal layers which involves the making of through-holes in the ceramic layer that isolates such metal layers, the method of the present invention enables the metal layers to be interconnected in an easy and reliable manner. In addition, the evaporation and ion sources used in practicing the method of the present invention may be the same as those employed in fabricating a laminated substrate of the type indicated by 2 in FIG. 5 and by employing such sources, the desired interconnection of metal layers can be established more easily.

The foregoing description assumes the case of providing interconnection of metal layers in a laminated substrate of the type indicated by 2 in FIG. 5 but it should be understood that this is not the only case in which the method of the present invention can be used and that it can be applied extensively to all situations where interconnection of thin metal layers is necessary in the production of various types of insulated substrates in which the thin metal layers alternate with thin ceramic layers.

FIG. 4 is a diagram showing the sequence of steps of interconnecting metal layers according to another example of the method of the present invention. The metal layers to be interconnected in this case are thin metal layers 8a and 8b in the laminated substrate 2 shown in FIG. 5.

Figures 4A, 4B, 4C:
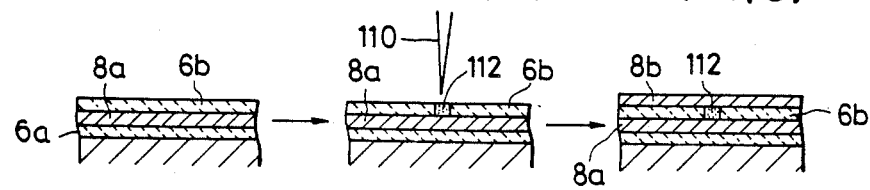
FIGS. 4(A)–4(C) are diagrams showing the sequence of steps of interconnecting metal layers according to another example of the method of the present invention.

First, a substrate having a thin ceramic layer 6b deposited on a thin metal layer 8a is provided [FIG. 4(A)]. The resulting assembly is accommodated in a vacuum chamber (not shown) and a micro ion beam 110 of a metal from an ion source (not shown) or the like is injected into a predetermined area of the ceramic layer 6b so as to form an alloyed area 112 (i.e., made of an alloy of the ceramic layer 6b and the injected metal) in the ceramic layer 6b that provides an electrical connection between the two surfaces thereof [FIG. 4(B)].

The metal which is ionized to form the micro ion beam 110 is preferably such that it readily forms an alloy with the ceramic layer 6b while providing a small resistance to electrical conduction and producing no impurities. A typical example is gold (Au). To put this in other way, the ceramic layer (e.g., 6b) which is to form the alloyed area 112 is preferably formed of a material such as AlN or $Si_3N_4$ that readily alloys with Au or any other kind of the metal to be ionized.

The micro ion beam 110 may be concentrated to have a varying size of diameter but for the purpose of attaining a fine-line pattern, a beam diameter of about 0.1 μm may be employed.

The acceleration energy of the micro ion beam 110 is preferably selected for a value that renders the range (i.e., mean projective range) of the ions being injected approximately equal to the thickness of the ceramic layer 6b. By selecting this value, the alloyed area 112 can be effectively created chiefly within the ceramic layer 6b. For example, less than several thousands Å is adequate for the thickness of the ceramic layer 6b if the laminated substrate to be finally produced is intended for use with semiconductor devices. Therefore, the energy required to accelerate the micro ion beam 110 need not be greater than about 100 keV. Needless to say, it would be of great help in reducing the acceleration energy of micro ion beam 110 if the thickness of the ceramic layer 6b is decreased to the extent that will do no harm to the purpose of attaining a desired electrical insulation.

The micro ion beam 110 may be injected into a small limited area of the thin ceramic layer 6b so as to form a kind of alloyed spot 112 in the ceramic layer 6b. Alternatively, the surface of the ceramic layer 6b may be scanned with the mirco ion beam 110 so as to form a patterned alloyed area 112 in the ceramic layer 6b. In the latter case, the patterned alloyed area 112 can be directly used as a wiring pattern for the ceramic layer 6b and subsequent deposition of a thin metal layer 8b may sometimes be omitted. Scanning with the micro ion beam 110 has the additional advantage that it enables the creation of a very fine circuit pattern that would not be attainable by the use of a mask or by any other conventional techniques.

The micro ion beam 110 suitable for use in the present invention may be produced by the following procedures: an ion beam is drawn out of an oven-type metal ion source using a Au-Si eutectic alloy as the material to be ionized; the beam thus drawn out is passed through a mass spectrometric magnet to extract Au ions according to their ratios of mass to charge; the extracted Au ions are speeded up by an accelerating means to a predetermined energy level while they are converged with an electrostatic lens. When scanning with the micro ion beam 110 is to be conducted, a scanning electrode may be provided after the electrostatic lens.

After the alloyed area 112 has been formed in the ceramic layer 6b by the procedure described above, another thin metal layer 8b is deposited on the ceramic layer 6b [FIG. 4(C)], with the result that the two metal layers 8a and 8b isolated by the ceramic layer 6b are interconnected in a predetermined pattern via the alloyed area 112. If more than one ceramic layer is to be formed in a laminated substrate, each ceramic layer may be treated by repeating the cycle of the procedures described above as many times as required.

After the alloyed area 112 has been formed in the ceramic layer 6b or subsequent processing for laminating a predetermined number of ceramic and metal layers has been completed, the ceramic layer(s) may be annealed at a temperature between about 200° and 600° C. in order to reduce or eliminate the internal damage (damaged site) that may have occurred in the alloyed area 112 or in some other portions as a result of ion implantation.

Unlike the prior art technique of establishing interconnection of metal layers which involves the making of through-holes in the ceramic layer that isolates such metal layers, the method of the present invention enables the metal layers to be interconnected in reliable manner while permitting micro working to provide a fine-line pattern. By employing this method, a laminated substrate featuring a highly integrated circuit pattern can be produced.

The foregoing description assumes the case of providing interconnection of metal layers in a laminated substrate of the type indicated by 2 in FIG. 5 but it should be understood that this is not the only case in which the method of the present invention can be used and that it can be applied extensively to all situations where interconnection of thin metal layers is necessary in the production of various types of insulated substrates in which the thin metal layers alternate with thin ceramic layers.

As described above, according to the present invention, thin metal layers in a laminated substrate can be interconnected in a simple and precise manner, and a highly economical package can be obtained, which has good characteristics such as high electrical insulation, heat conductivity, reliability and adhesive property of a layer to the underlying layer.

What is claimed is:

1. A process of providing interconnections of metal layers in the production of a laminated substrate comprising thin metal layers and electrically insulating thin ceramic layers, comprising:
    a first step of evaporating a metal on a first surface of at least one of said thin ceramic layers while in a vacuum with a mask being disposed on said surface of said ceramic layer;
    a second step of forming an alloyed area in said ceramic layer by heating said evaporated metal to diffuse said metal into and through said thin ceramic layer to reach a second surface of said ceramic layer; and
    a third step of forming one of said thin metal layers on said first surface of said ceramic layer,
    so as to create an electrical connection between said one of said thin metal layers and another of said thin metal layers disposed on said second surface of said one of said thin ceramic layers.

2. The process of claim 1, wherein prior to said step of evaporating said metal, a beam of ionized inert gas is applied through said mask to a portion of said first surface of said one of said thin ceramic layers on which said metal is to be evaporated.

* * * * *